United States Patent [19]
Mobin et al.

[11] Patent Number: 6,009,128
[45] Date of Patent: Dec. 28, 1999

[54] METRIC ACCELERATION ON DUAL MAC PROCESSOR

[75] Inventors: Mohammad Shafiul Mobin, Whitehall; Sivanand Simanapalli, Allentown; Larry R. Tate, South Barrington, all of Pa.

[73] Assignee: Lucent Technologies, Inc., Murray Hill, N.J.

[21] Appl. No.: 08/925,362

[22] Filed: Sep. 8, 1997

[51] Int. Cl.⁶ .................................................. G06F 11/10
[52] U.S. Cl. ........................ 375/341; 714/795; 714/796
[58] Field of Search .................................. 375/262, 341; 714/794, 796

[56] References Cited

U.S. PATENT DOCUMENTS

| | | | |
|---|---|---|---|
| 5,454,014 | 9/1995 | Blaker et al. | 375/341 |
| 5,465,275 | 11/1995 | Blaker et al. | 375/341 |
| 5,471,500 | 11/1995 | Blaker et al. | 375/340 |
| 5,490,178 | 2/1996 | Blaker et al. | 375/341 |
| 5,559,837 | 9/1996 | Blaker et al. | 375/341 |
| 5,619,514 | 4/1997 | Smith | 714/795 |
| 5,802,116 | 9/1998 | Baker et al. | 375/341 |

*Primary Examiner*—Amanda T. Le
*Attorney, Agent, or Firm*—David L. Smith

[57] ABSTRACT

There is disclosed, a method and apparatus for processing a signal in a pipeline. The method includes retrieving a present state cost. Simultaneously with receiving the present state cost, an estimated symbol and a received symbol are obtained, a difference between the received and estimated symbols is found, the difference between the received and esitmated symbols is squared, and the present state cost is added to the squared difference to generate a next state cost. The apparatus includes hardware to carry out the method.

13 Claims, 2 Drawing Sheets

FIG. 2

| INPUT | PRESENT STATE | PRESENT STATE COST | BRANCH METRIC | NEXT STATE | NEXT STATE COST |
|---|---|---|---|---|---|
| ○ ——<br>1 - - - | | | | | |
| | 0000 | PS (0) | $m_0$ | 0000 | NS (0) |
| | 0001 | PS (1) | $m_1$ | 0001 | NS (1) |
| | 0010 | PS (2) | $m_2$ | 0010 | NS (2) |
| | 0011 | PS (3) | $m_3$ | 0011 | NS (3) |
| | 0100 | PS (4) | $m_{16}$ | 0100 | NS (4) |
| | 0101 | PS (5) | $m_{17}$ | 0101 | NS (5) |
| | 0110 | PS (6) | | 0110 | NS (6) |
| | 0111 | PS (7) | | 0111 | NS (7) |
| | 1000 | PS (8) | $m_{10}$ | 1000 | NS (8) |
| | 1001 | PS (9) | $m_{11}$ | 1001 | NS (9) |
| | 1010 | PS (10) | | 1010 | NS (10) |
| | 1011 | PS (11) | $m_{26}$ | 1011 | NS (11) |
| | 1100 | PS (12) | | 1100 | NS (12) |
| | 1101 | PS (13) | $m_{27}$ | 1101 | NS (13) |
| | 1110 | PS (14) | $m_{30}$ | 1110 | NS (14) |
| | 1111 | PS (15) | $m_{31}$ | 1111 | NS (15) |

METRIC ACCELERATION ON DUAL MAC PROCESSOR

TECHNICAL FIELD

This invention relates generally to transmitting information over a channel and particularly to metric acceleration on a dual MAC processor.

BACKGROUND OF THE INVENTION

A viterbi decoder is a maximum likelihood decoder that provides forward error correction. Viterbi decoding is used in decoding a sequence of encoded symbols, such as a bit stream. The bit stream can represent encoded information in a system that is transmitted through various media with each set of bits representing a symbol instant. Viterbi decoding is employed in digital communications over any communication channel, such as satellite-to-earth, cellular telephony, computer-to-disk, modem-to-modem and others. Viterbi decoders have been implemented on hardware having a single multiply-accumulate (MAC) capability such as single MAC microprocessors, microcontrollers, or digital signal processors. Viterbi decoding is well known and applications can be found in U.S. Pat. Nos. 5,490,178; 5,454,014; 5,559,837; 5,465,275; and 5,471,500, the disclosures of which are hereby incorporated by reference.

A viterbi implementation consists of four steps: (1) branch and path metric computation; (2) a compare-select operation; (3) a minimum or maximum state cost determination; and (4) a traceback operation. In the decoding process, a viterbi decoder works back through a sequence of possible bit sequences at each symbol instant to determine which one-bit sequence was most likely to have been transmitted. The possible transitions from a state at one symbol instant or state to a state at a next, subsequent symbol instant or state is limited. Each possible transition from one state to a next state can be shown graphically and is defined as a branch. A sequence of interconnected branches is defined as a path. Each state can only transition to a limited number of next states upon receipt of the next bit or bits in the bit stream. Thus, some paths survive and other paths do not survive during the decoding process. By eliminating those transitions that are not permissible, computational efficiency can be achieved in determining the most likely paths to survive. The viterbi decoder typically defines and calculates a branch metric associated with each branch and employs the branch metric to determine which paths survive and which paths do not survive.

A branch metric is calculated at each symbol instant for each possible branch. Each path has an associated metric or accumulated cost that is updated at each symbol instant. For each possible transition, the accumulated cost for the next state is calculated as an extremum of the sum of the branch metric for the possible transitions and the path accumulated cost at the previous state. Either the maximum or minimum extremum may be selected.

While several paths survive the transition from one symbol instant to the next symbol instant, a traceback operation through the possible branches is employed to select the most likely bit or bit sequence to have been transmitted. Representing the sequential symbol instants in an array is referred to as a trellis. Identifying the extremum accumulated cost path starting with a given symbol instant is referred to as a traceback operation. The number of symbol instants back through the trellis that the extremum accumulated cost path extends is the length, or depth, of the traceback operation. The individual state in the trellis associated with the extremum accumulated cost at the end of the traceback operation is translated into the most likely bit or bits to have been transmitted in that symbol instant. The bit or group of bits is referred to as a decoded symbol.

Historically viterbi decoders have been implemented on hardware having a single MAC capability which limits the efficiency that can be achieved in digital processing of the transmitted signal. What is needed is a multiple MAC capability to provide a more efficient implementation of a viterbi decoder.

SUMMARY OF THE INVENTION

In accordance with the invention, a method of processing a signal in a pipeline includes prefetching a received symbol, and retrieving a present state cost. Simultaneously with receiving the present state cost, an estimated symbol is obtained, a difference between the received and estimated symbols is found, the difference between the received and estimated symbols is squared, and the present state cost is added to the squared difference to generate a next state cost.

BRIEF DESCRIPTION OF THE DRAWINGS

FIG. 2 is a portion of a present-state, next-state diagram illustrating a viterbi butterfly in a 16 state example.

DETAILED DESCRIPTION

Figure 1:
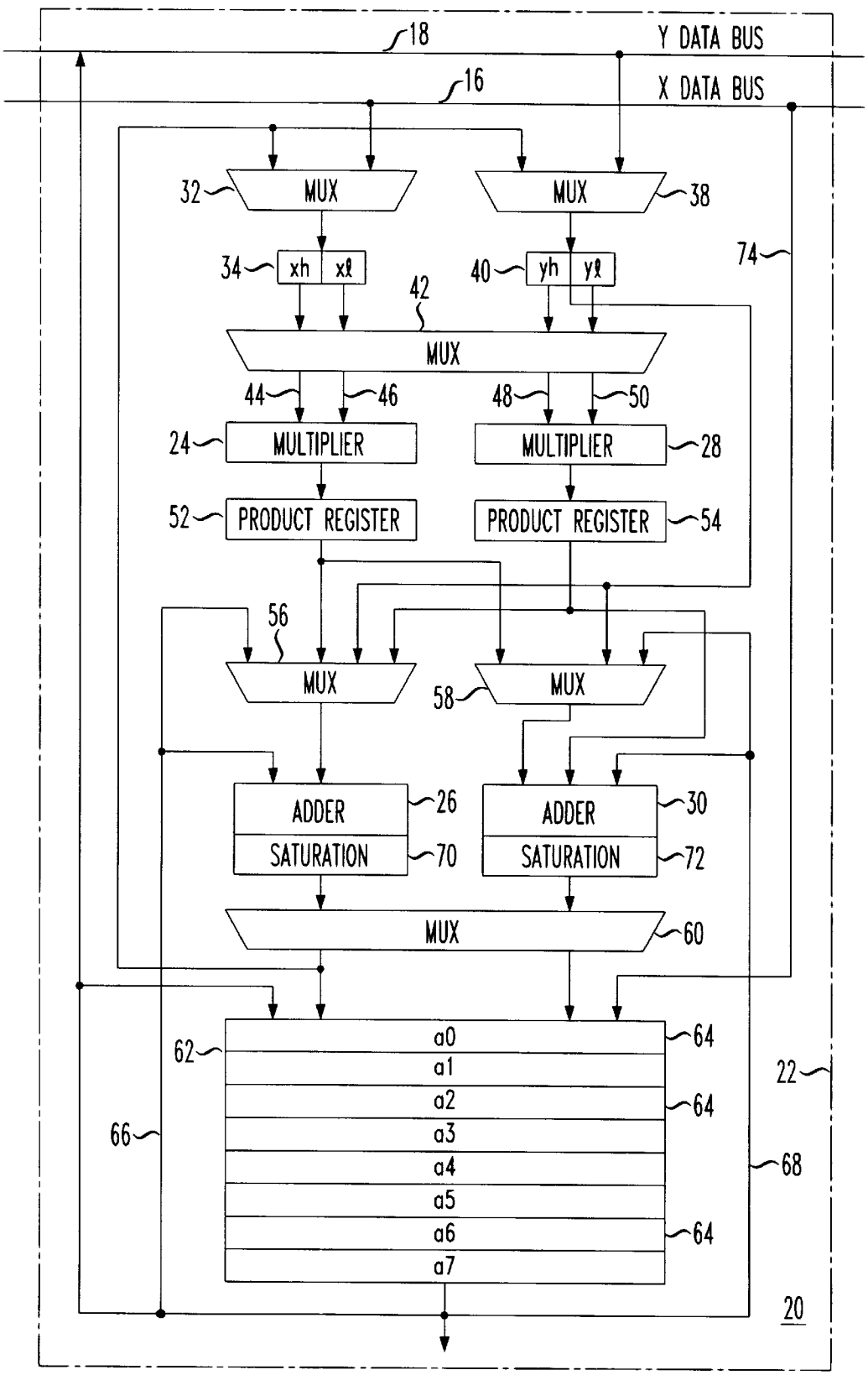
FIG. 1 is a schematic diagram of a portion of a data arithmetic unit in accordance with the present invention.

FIG. 1 shows a schematic diagram of a portion of a data arithmetic unit (DAU) 20 which may be part of an integrated circuit which in turn is part of a transceiver in a communication system or a portion of a communication system such as a mobile digital cellular telephone. DAU 20 is a portion of a processor 22 such as a microcontroller, microprocessor, or digital signal processor. DAU 20 includes a multiplexer 32 to select an input to a first input register 34 from a plurality of inputs. Input register 34 may be segmented into high and low portions containing xh bits and xl bits represented as xh and xl portions. First input register 34 is a 2 n-bit register having high and low portions. An n-bit word can be multiplexed into each of the high portion, xh, and low portion, xl. The expression 2 n-bit is intended to be twice a word length n-bits plus appropriate guard bits. DAU 20 includes at least two multiply-accumulate paths. Multiplier 24 and adder 26 provide a first multiply-accumulate path; multiplier 28 and adder 30 provide a second multiply-accumulate path. Multiplier 32 may have inputs coupled to a first data bus 16, also designated the X data bus, and a feedback path 36 from the output of adders 26 and 30. Multiplexer 38 selects an input from the plurality of inputs as an input to second input register 40, also designated the y register. Second input register 40 may be segmented into high and low portions containing yh bits and yl bits. Similarly, second input register 40 is a 2 n-bit register having high and low portion. Multiplexer 38 may be coupled to a second data bus 18, also designated the Y data bus, and feedback path 36 from the output of adders 26 and 30.

The xh and xl bits from first input register 34 as well as the yh and yl bits from second input register 40 are independently available to each multiplier 24 and 28 by way of crossover multiplexer 42. Crossover multiplexer 42 provides two inputs to each multiplier 24 and 28. Inputs 44 and 46 are provided to multiplier 24; inputs 48 and 50 are provided to multiplier 28. An n-bit word can be multiplexed into each of the high half and low half of each of registers 34 and 40. The output from either the high half or low half of either first input register 34 or second input register 40 can provide any of the inputs 44, 46, 48 or 50 to multipliers 24 and 28 through crossover multiplexer 42.

The product output from multiplier 24 is stored in a first product register 52, also designated p0, and is provided as an input to both multiplexers 56 and 58. Similarly, the product output from multiplier 28 is stored in a second product register 54, also designated p1, and is provided as input to both multiplexer 56 and multiplexer 58. Multiplexers 56 and 58 also have available as an input the contents of second input register 40.

Accumulator file 62 is comprised of a plurality registers 64. Registers 64 comprising accumulator file 62 are also 2 n-bit registers accessible by high and low portions. The output of accumulator file 62 is coupled by line 66 as an input to multiplexer 56 and adder 26, and by line 68 as an input to multiplexer 58 and adder 30.

The output of multiplexer 56 provides an input to adder 26. The sum output from adder 26 is passed through saturation block 70 to limit the output to an extremum value during overflow or underflow, and coupled as an input to multiplexers 32 and 38. Similarly, the output of multiplexer 56 provides an input to adder 30. The sum output from adder 30 is passed through saturation block 72 to limit the output to an extremum value during overflow or underflow, and coupled as an input to multiplexers 32, 38 and 60.

Multiplexer 60 can provide the output of either adder 26 or 30 to the high and/or low bit portions of any of registers 64 in accumulator file 62.

The select inputs to the various multiplexers are set by an instruction decoder in a control section of the processor architecture, not shown, to choose the appropriate input as an output as will be clear from the discussion below.

Implementation of a portion of the signal processing in a transceiver consists of steps (1) branch and path metric computation; (2) a compare-select operation; (3) an extremum (minimum or maximum) cost determination; and (4) a traceback operation. FIG. 2 shows a portion of a present-state, next-state diagram illustrating a viterbi butterfly for a 16-state example in which two possible present state paths can transition to a single next state.

The circuit illustrated in FIG. 1, when operating in a pipelined manner performing viterbi decoding such as when part of a transceiver, performs the following steps in a single clock cycle. They are: (1) retrieve a present state cost and load the retrieved present state cost in an accumulator register; (2) load an in-phase and quadrature estimated symbol and load the in-phase and quadrature received symbol into a register; (3) square the difference between quadrature portions of a received symbol and an estimated symbol and load the result in a first product register; (4) square the difference between in-phase received and estimated symbols and load the result in a second product register; (5) add the present state cost to the squared differences (both (3) and (4)) and store the sum in an accumulator; and (6) find the difference between the received and estimated symbols for both in-phase and quadrature, and load the results in a register.

Before discussing an instruction, which when implemented, causes DAU 20 to simultaneously perform the steps listed above in a viterbi decoding operation, the instructions to fill the pipeline will first be explained. Pipelining is achieved by initiating computation with a new data set before completing computations with a previous data set. The more latches used in pipelining, the greater the depth of pipelining. Pipelining causes an initial latency in computation time required to fill the pipeline, but maximizes usage of resources such as adders. Equations (1) through (4) illustrate filling the pipeline. Once the pipeline is filled, equations (5) through (7) may be executed repreatedly to perform the add-compare-select operations of viterbi decoding. A new received symbol will be loaded in accordance with equation (1), as required $$a5 = *r1++ \tag{1}$$

$$y = *r0++ \tag{2}$$

$$xh=a5h-yh \ xl=a5l-yl \ y=*r0++ \tag{3}$$

$$xh=a5h-yh \ xl=a5l-yl \ p0=xh2 \ p1=xl2 \ y=*r0++ \ a4h=*pt0++ \tag{4}$$

$$xh=a5h-yh \ xl=a5l-yl \ a0=a4+p0+p1 \ p0=xh2 \ p1=xl2 \ y=*r0++ \ a4h=*pt0++ \tag{5}$$

$$xh=a5h-yh \ xl=a5l-yl \ a1=a4+p0+p1 \ p0=xh2 \ p1=xl2 \ y=*r0++ \ a4h=*pt0++ \tag{6}$$

$$a0=cmp1(a1, a0) \tag{7}$$

Equation (1) loads the received symbol to which pointer r1 is pointing into accumulator 62, file register a5 for processing. Equation (2) loads an estimated symbol into the second input register 40, also designated the y register.

Equation (3) from left-to-right computes the in-phase and quadrature differences between the received symbol loaded in equation (1) and an estimated symbol loaded in equation (2). Equation (4) also loads a new estimated symbol into second input register 40.

Equation (4) from left-to-right computes the in-phase and quadrature differences between the received symbol of equation (1) and an estimated symbol of equation (3). The in-phase and quadrature differences computed in equation (3) are squared and stored in product register 52, also known as register p0 and product register 54, also known as register p1. A new estimated symbol is loaded into second input register 40, and a present state cost is loaded into accumulator file 62 register a4h. This sequence fills the pipeline for iterative computations represented by equations (5) through (7). Once the pipeline is filled, a metric computation is completed in one clock cycle by each of equations (5) and (6). Each occurrence of a new received symbol necessitates executing equations (1) through (4) to reinitialize the pipeline. Equation (7) is a compare/select equation that compares the two potential next state costs, one computed by equation (5) and the other computed by equation (6), and selects an extremum (either a maximum or minimum) for further processing, as is known in the art.

An instruction, which when implemented, causes DAU 20 to simultaneously perform the steps listed above, and which is representative of equations (5) and (6) is shown as equation (8).

$$xh=a5h-yh \ xl=a5l-yl \ a0=a4+p0+p1 \ p0=xh2 \ p1=xl2 \ y=*r0++ \ a4h=*pt0++ \tag{8}$$

Equation (8) instructs DAU 20 to simultaneously, in a single clock cycle, perform all of the functions in equation (8) in a pipeline environment.

The following description assumes the pipeline is full. Starting from the right side of equation (8), a present state cost, PS(1) is retrieved from the X data bus 16 and is loaded into the high portion of an accumulator register 64, designated register a4.

An estimated symbol e(3) that is an estimate of the received symbol is retrieved from the Y data bus 18, passed through multiplexer 38 and stored in the second input register 40. For example, the in-phase estimated symbol $e_I(3)$ may be stored in the high portion, yh, of second input register 40 and the quadrature estimated symbol $e_Q(3)$ may be stored in the low portion, yl, or the second input register 40. The estimated symbol is also provided as an input to adder 26 by way of line 74.

A metric is calculated; the Euclidean metric is illustrated, The difference between quadrature received and estimated symbols, computed in a previous clock cycle in the pipeline and stored in the low portion, xl, of first input register 34, is squared. The low portion, xl, of first input register 34 provides both inputs 48 and 50 to multiplier 28 by way of multiplexer 42. The difference between the quadrature received, $X_Q(n)$, and estimated symbols is squared in multiplier 28 and stored in product register 54, also designated p1. The quantity being computed is: $[X_Q(n)-e_Q(1)]^2$.

Similarly, the difference between in-phase received and estimated symbols, also computed in a previous clock cycle in the pipeline and stored in the high portion, xh, of the first input register 34 is squared. The high portion, xh, of the first input register 34 provides both inputs 44 and 46 to multiplier 24 by way of multiplexer 42. The difference between the in-phase received and estimated symbols is squared in multiplier 24 and stored in product register 52, also designated register p0. The quantity being computed is: $[X_I(n)-e_I(1)]^2$.

The present state cost is updated to generate a next state cost by adding to the present state cost stored in accumulator register file 62, register a4, the squared differences produced by multipliers 24 and 28 and stored in product registers 52 and 54. Register a4 of accumulator register file 62 provides a first input to adder 30 by way of line 68. Product register 52 and second input register 40 provide two inputs to adder 30 by way of multiplexer 58. Second input register 40 provides another input directly to adder 30. Adder 30 adds the squared differences to the present state cost to generate a first potential next state cost, $NS(0)_1$. The quantity being computed is:

$$NS(0)_1 = PS(0) + [X_I(n)-e_I(0)]^2 + [X_Q(n)-e_Q(0)]^2$$

The first potential next state cost, which is the sum output from adder 30 is stored in accumulator file 62 register a0.

The received symbol being processed is stored in accumulator 62 register as. The in-phase portion of the received symbol is stored in the high portion of register a5 and the quadrature portion of the received symbol is stored in the low portion of register a5. The received symbol is provided as an input to adder 26 by way of line 66. Adder 26 is capable of performing two separate n-bit addition or subtraction operations, one on the lower end bits and one on the upper end bits. Adder 26 operates as a split adder to compute the difference between the quadrature portions of the received and estimated symbols in the low half and the difference between in-phase portions of the received and estimated symbols in the high half.

The difference between the received and estimated symbols is provided as an input to the first input register 34 over feedback path 36, by way of multiplexer 32, in preparation for another metric calculation, sometimes referred to as a branch metric calculation. Feedback path 36 permits the output of either adder 26 or 30 to be latched into either the high or low portions of either first or second input registers 34 or 40, as desired. In this manner, feedback path 36 from adders 26 and 30 are used to compute two branch metrics simultaneously. Adder 30 computes the path metric by summing the two branch metrics and the present state cost.

By executing an equation of the form of equation (8) twice, such as equations (5) and (6), followed by a compare operation, such as equation (7), the entire viterbi add-compare-select operation can be completed.

With the independent variable, usually time, represented in equations (1) through (8) discretized, and with discrete time represented by the potential next state cost in equations (5), (6) and (8) being arbitrarily referenced as n, the other quantities being simultaneously computed in equations (5) and (6) can be expressed in intervals relative to n. For example, n+1 suggests a term that will contribute to a potential next state cost one discrete time unit after the present, or n, time. Similarly, n+2 suggests a term that will contribute to a potential next state cost two discrete time units after the present, or n, time.

Equation (8) is executed repeatedly once the pipeline is full. Referencing the quantities in equation (8) to n, it can be said that equation (8) simultaneously: adds an (n)th present state cost to the (n)th branch metric to generate an (n)th potential next state cost; retrieves an (n+1)th present state cost; computes a (n+1)th branch metric; determines an (n+2)th difference between the received symbol and the (n+2)th estimated symbol; and obtains an (n+3)th estimated symbol.

The invention is particularly useful in communication systems and equipment employing integrated circuits including this technique. Such communication systems and equipment have the advantage of an accelerated metric computation in a viterbi decoder requiring fewer clock cycles than in the prior art.

Furthermore, the invention may employ either soft or hard symbols with flexible soft symbol precision. The extremum branch metric can be either a maximum or minimum. Furthermore, applications in which more than two possible present state paths can transition into a single next state are contemplated as being within the invention even though the invention is only illustrated as showing two possible present state paths transitioning into a single next state.

The invention claimed is:

1. A method of processing a signal in a pipeline representing discrete units of an independent variable, n being a reference unit of the independent variable, comprising the steps of:

preloading a received symbol; and adding an (n)th present state cost to the (n)th branch metric to generate an (n)th potential next state cost, and simultaneously with the addition:

retrieving an (n+1)th present state cost;

computing an (n+1)th branch metric;

determining an (n+2)th difference between the received symbol and the (n+2)th estimated symbol; and obtaining an (n+3)th estimated symbol.

2. A method of processing a signal in a pipeline representing discrete units of an independent variable, n being a reference unit of the independent variable, comprising the steps of:

preloading a received symbol; and adding a first (n)th present state cost to a first (n)th branch metric to generate a first (n)th potential next state cost and simultaneously with the addition:

retrieve a first (n+1)th present state cost;

compute a first (n+1)th branch metric;

determine a first (n+2)th difference between the received symbol and the (n+2)th estimated symbol; and obtaining a first (n+3)th estimated symbol; and adding a second (n)th present state cost to a second (n)th branch metric to generate a second (n)th potential next state cost and simultaneously with the addition:
retrieve a second (n+1)th present state cost;
compute a second (n+1) the branch metric;
determine a second (n+2)th difference between the received symbol and the (n+2)th estimated symbol.

3. A method of processing a signal in a pipeline, comprising the steps of:
preloading a received symbol; and
retrieving a present state cost; and simultaneously with retrieving the present state cost:
obtaining an estimated symbol;
finding a difference between the received and estimated symbols;
squaring the difference between the received and estimated symbols; and
adding the present state cost to the squared difference to generate a next state cost.

4. A method of processing a signal as recited in claim 3, wherein the difference finding step further comprises the steps of:
finding a difference between received and estimated quadrature symbols; and
finding a difference between received and estimated in-phase symbols.

5. A method of processing a signal as recited in claim 4, wherein the difference squaring step further comprises the steps of:
squaring the difference between quadrature received and estimated symbols; and
squaring the difference between in-phase received and estimated symbols.

6. A method of processing a signal as recited in claim 3, wherein the difference squaring step further comprises the steps of:
squaring the difference between quadrature received and estimated symbols; and
squaring the difference between in-phase received and estimated symbols.

7. A method of processing a signal in a pipeline, comprising the steps of:
preloading first and second received symbols; and
retrieving a first present state cost; and simultaneously with retrieving the first present state cost:
obtaining a first estimated symbol;
finding a difference between the first estimated symbol and the first received symbol;
squaring the difference between the first estimated symbol and the first received symbol; and
adding the first present state cost to the squared difference between the first estimated symbol and the first received symbol to generate a first next state cost; and
retrieving a second present state cost; and simultaneously with retrieving the second present state cost:
obtaining a second estimated symbol;
finding a difference between the second estimated symbol and the second received symbol;
squaring the difference between the second estimated symbol and the second received symbol; and
adding the second present state cost to the squared difference between the second estimated symbol and the second received symbol to generate a second next state cost.

8. A method of processing a signal as recited in claim 7, further comprising the step of comparing the first next state cost to the second next state cost.

9. A method of processing a signal as recited in claim 7, further comprising the step of selecting one of the first and second next state cost based on an extremum.

10. A method of processing a signal as recited in claim 9, wherein the extremum comprises a maximum.

11. A method of processing a signal as recited in claim 9, wherein the extremum comprises a minimum.

12. A method of processing a signal in a pipeline, comprising the step of:
retrieving in-phase and quadrature received symbols and loading the symbols in a register; and
retrieving a present state cost and loading the retrieved present state cost into an accumulator; and
simultaneously with retrieving the present state cost:
retrieving in-phase and quadrature estimated symbols and loading the symbols in a register;
finding a difference between received and estimated quadrature symbols and loading the difference in a register;
finding a difference between received and estimated in-phase symbols and loading the difference in a register;
squaring the difference between received and estimated quadrature symbols and loading the squared difference in a first product register;
squaring the difference between received and estimated in-phase symbols and loading the squared difference in a second product register; and
adding the present state cost to the squared differences stored in the first and second product registers to generate a next state cost in an accumulator register.

13. A circuit for processing a signal, comprising:
a circuit adapted to preload a received symbol into a register;
a circuit adapted to retrieve a present state cost;
a circuit adapted to obtain an estimated symbol simultaneously with retrieval of the present state cost;
a circuit adapted to receive the present state cost and estimated symbol, the circuit adapted to compute a branch metric simultaneously with retrieval of the present state cost; and
a circuit adapted to combine the present state cost and the branch metric to generate a next state cost simultaneously with retrieval of the present state cost.

* * * * *